United States Patent [19]

Naghshineh

[11] Patent Number: 4,931,673
[45] Date of Patent: Jun. 5, 1990

[54] ECL-TO-TTL TRANSLATOR CIRCUIT WITH GROUND BOUNCE PROTECTION

[75] Inventor: Kianoosh Naghshineh, Menlo Park, Calif.

[73] Assignee: Advanced Micro Devices, Inc., Sunnyvale, Calif.

[21] Appl. No.: 415,754

[22] Filed: Oct. 2, 1989

[51] Int. Cl.[5] .................. H03K 19/092; H03K 19/088
[52] U.S. Cl. ..................................... 307/475; 307/456; 307/296.4; 307/296.6; 307/443
[58] Field of Search ............ 307/443, 456, 475, 296.4, 307/296.6

[56] References Cited
U.S. PATENT DOCUMENTS 4,609,837 9/1986 Yagyuu et al. ..................... 307/475
4,794,317 12/1988 van Tran .......................... 307/475

Primary Examiner—Stanley D. Miller
Assistant Examiner—Margaret Rose Wambach
Attorney, Agent, or Firm—Davis Chin

[57] ABSTRACT

An ECL-to-TTL translator circuit for converting ECL logic level signals to TTL logic level signals includes an active pull-down circuit (120), a high level voltage clamping circuit (122), and ground bounce protection circuit (124) so as to provide a higher speed of operation with minimal power dissipation and a significant reduction in ground bounce noise. The ground bounce protection circuit is formed of a voltage-independent current source, a reference resistor (R15), and a switching transistor (Q15).

17 Claims, 2 Drawing Sheets

ECL-TO-TTL TRANSLATOR CIRCUIT WITH GROUND BOUNCE PROTECTION

BACKGROUND OF THE INVENTION

This invention relates generally to logic level translators and more particularly, it relates to a logic translator device for converting ECL logic level signals to TTL logic level signals which has an active pull-down circuit, a high level voltage clamping circuit, and a ground bounce protection circuit so as to provide a higher speed of operation with minimal power dissipation and a significant reduction in ground bounce noise.

As is generally well known in the art, various types of digital logic circuits are widely used in the area of computer data processing systems in different parts of the processing system. In order to transfer data from one part of the processing system utilizing one logic type (i.e.. ECL) of integrated circuit devices to another part utilizing another logic type (i.e.. TTL) of integrated circuit devices, there is often required a translation from the one logic type to the other logic type. Since many of these processing systems are designed with both ECL and TTL logic circuits due to their superior switching speeds, there has been encountered a need for interface circuits such as ECL-to-TTL and TTL-to-ECL translators so that these two different types of logic circuits will be compatible with each other.

In FIG. 1, there is shown one such conventional translator which is known as an ECL-to-TTL translator 10 which provides an output capable of being either at an active high level or an active low level. The ECL-to-TTL translator typically uses first and second bipolar transistors connected in series between first and second power supply terminals. The first bipolar transistor T9 is coupled between the first power supply terminal and an output terminal 22, and the second bipolar transistor T4 is coupled between the output terminal and the second power supply terminal. In operation, the active high level is achieved at the output terminal by turning on the first bipolar transistor T9 and turning off the second bipolar transistor T4. On the other hand, the active low level can be obtained by turning off the first bipolar transistor T9 and turning on the second bipolar transistor T4. A high impedance tristate may be achieved by turning off both the first and second bipolar transistors through an enable gate (not shown).

The switching ON and OFF of the first and second bipolar transistors T9, T4 to realize the transitions on the output terminal causes sudden surges of current creating what is commonly known as current spikes or glitches. These current spikes or glitches will flow through the impedance and inductive components of power supply lines so as to cause inductive noise at internal power supply potential and ground potential nodes of the translator. In particular, when the second bipolar (pull-down) transistor is quickly turned ON a large instantaneous current cooperating with the line inductance to pull down the internal ground potential node A which is defined as "ground bounce noise". This ground bounce noise, if excessive, could affect the input signals of an internal logic circuit 16 which temporarily causes the output terminal 22 of the translator to change states, thereby resulting in an erroneous output.

It would therefore be desirable to provide an improved ECL-to-TTL translator which has a ground bounce protection circuit but yet has a greater switching speed with minimal power dissipation. The ECL-to-TTL translator of the present invention includes a ground bounce protection circuit coupled to a lower output transistor in the output stage for maintaining the same in its turned-off condition when the internal ground potential node is pulled down due to switching of the output terminal between a low logic level and a high logic level.

SUMMARY OF THE INVENTION

Accordingly, it is a general object of the present invention to provide an improved ECL-to-TTL translator circuit which is relatively simple and economical to manufacture and assemble, but yet overcomes the disadvantages of the prior art translator circuits.

It is an object oF the present invention to provide an improved ECL-to-TTL translator which has a ground bounce protection circuit but yet has a greater switching speed with minimal power dissipation.

It is still another object of the present invention to provide an ECL-to-TTL translator circuit which has a higher speed of operation with minimal power dissipation and a significant reduction in ground bounce noise than has been traditionally available.

It is still yet another object of the present invention to provide a logic translator device for converting ECL logic level signals to TTL logic level signals which includes an active pull-down circuit, a high level voltage clamping circuit, and a ground bounce protection circuit so as to provide higher switching speeds.

In accordance with these aims and objectives, the present invention is concerned with the provision of an improved ECL-to-TTL translator circuit for converting ECL logic level signals to TTL logic level signals which includes an ECL circuit, an input stage, a TTL output stage, and a ground bounce protection circuit. The ECL circuit receives true and complementary data input signals having ECL logic levels and generates input signals. The input stage is responsive to the input signals for generating first and second control signals. The TTL output stage is responsive to the control signals for generating at an output terminal an output signal which is TTL-compatible. The output stage is formed of an upper TTL output transistor and a lower TTL output transistor. The ground bounce protection circuit is coupled to the lower output transistor for maintaining the same in its turned-off condition when a ground potential is being pulled down due to switching of the output terminal between a low logic level and a high logic level.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
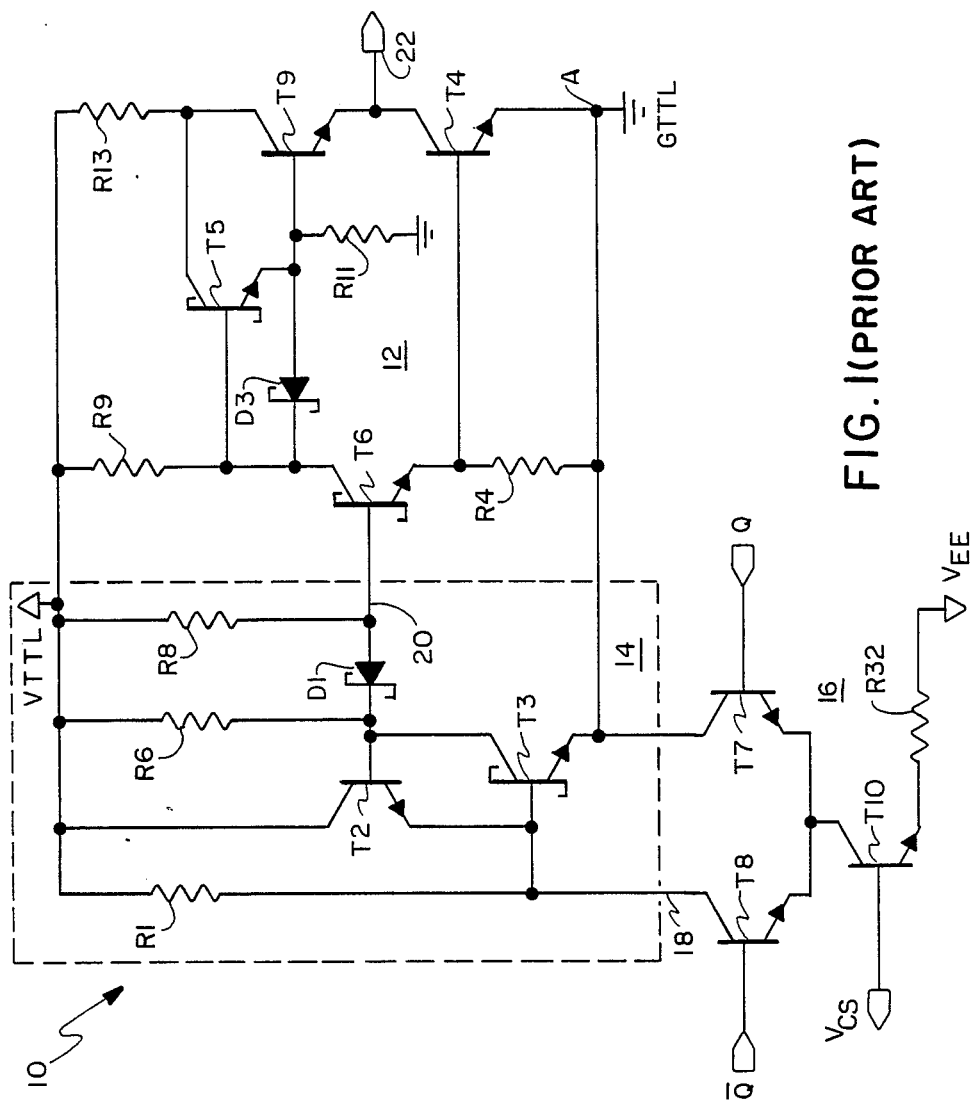
FIG. 1 is a detailed schematic circuit diagram of an ECL-to-TTL logic translator of the prior art.

Referring now in detail to the drawings, there is shown in FIG. 1 a schematic circuit diagram of a conventional prior art ECL-to-TTL translator device 10 which is used for converting ECL logic level signals to TTL-compatible logic level signals. The translator device 10 is comprised of a TTL push-pull output driver stage 12, an input stage 14, and an ECL circuit stage 16. The ECL circuit stage 16 receives data input signals Q and $\overline{Q}$ and produces an output signal on line 18. In response to the output signal from the ECL circuit stage 16, the input stage 14 produces a corresponding logic signal on line 20, at the base of a phase-splitting transistor T6. In a conventional manner, the TTL output stage 12 generates on output terminal 22, a TTL-level logic signal which is inverted from the logic signal received on the line 20. Thus, when the ECL logic level $\overline{Q}$ is at a low or logic state the TTL-level logic signal on the output terminal 22 will be at a high or logic "1" state.

The TTL-level logic signal on the output terminal is generated by the switching ON and OFF of the upper and lower TTL output transistors T9 and T4, respectively, which continually operate in opposite states. This switching of the output transistors T9 and T4 is achieved by the phase-splitting transistor T6 which provides the bases of these transistors with voltages that swing in opposite directions. Such switching, which is used to effect the high-to-low or low-to-high transition on the output terminal 22, may cause both output transistors to be "on" for a brief period of time. As a result, a low impedance current path is created between the TTL power supply potential VTTL and the TTL ground potential GTTL which produces current spikes or glitches. These current spikes interact with the line impedance to cause sometimes a temporary drop in the power supply potential VTTL or a temporary drop in the ground potential GTTL. In particular, the current spike on the ground potential GTTL is sometimes referred to as "ground bounce noise".

Since it is generally known that the ECL circuit stage 16 has small logic swing and low noise margin characteristics, it is especially susceptible to noise spikes caused by the switching of the output transistors. If such noise spikes (current spikes) exceed the noise margin of the ECL stage 16, it can cause the ECL stage to change states temporarily thereby inducing a false logic output. As can be seen, the translator device 10 of FIG. 1 offers no protection against such ground bounce noise.

Figure 2:
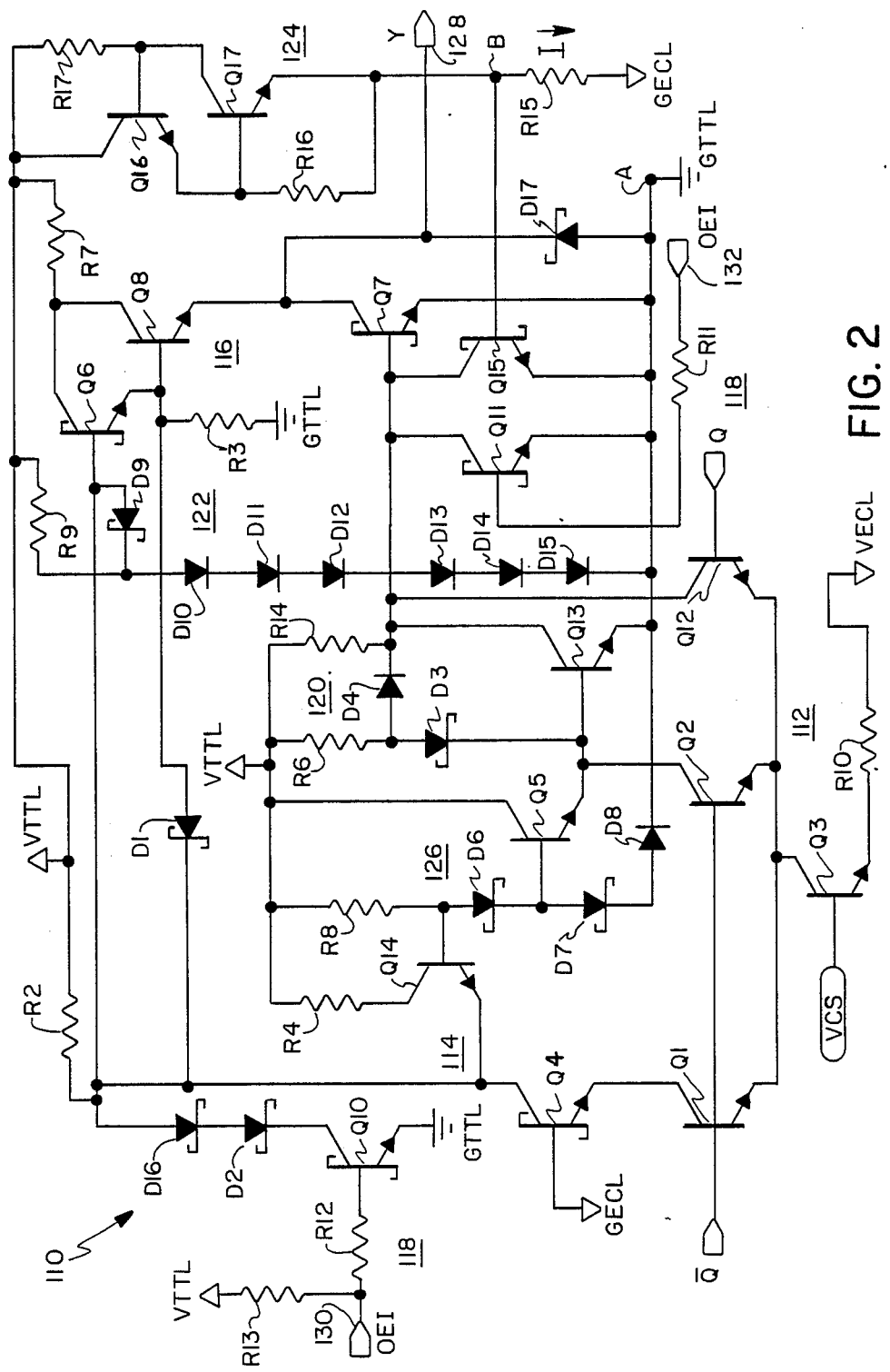
FIG. 2 is a detailed schematic circuit diagram of an ECL-to-TTL translator circuit, constructed in accordance with the principles of the present invention.

FIG. 2 is a schematic circuit diagram illustrating an improved ECL-to-TTL translator circuit 110 constructed in accordance with the principles of the present invention. The translator circuit 110 represents a substantial improvement over the prior art translator circuit 10 and includes an active pull-down circuit, a high level voltage clamping circuit, and a ground bounce protection circuit so as to provide a higher speed of operation with minimal power dissipation and a significant reduction in ground bounce noise. The translator circuit 110 is comprised of an ECL circuit stage 112, an input stage 114, a TTL output stage 116, a tristate enable gate 118, an active pull-down circuit 120, a high level voltage clamping circuit 122, and a ground bounce protection circuit 124.

The ECL circuit stage 112 includes first, second, and third input-stage transistors Q1, Q2 and Q12 of the NPN-type conductivity. The emitters of the transistors Q1, Q2 and Q12 are connected together and to a current source formed of a bipolar transistor Q3 and an emitter resistor R10. The collector of the current source transistor Q3 is connected to the common emitters of the transistors Q1, Q2 and Q12. The emitter of the transistor Q3 is connected to one end of the emitter resistor R10. The other end of the resistor R10 is tied to an ECL power supply potential VECL, which typically is at −5.0 volts. The base of the transistor Q3 is connected to a reference voltage $V_{cs}$. The base of the third input-stage transistor Q12 is connected to receive a true data input signal Q, and the bases of the first and second input-stage transistors Q1 and Q2 are connected to receive a complementary data input signal $\overline{Q}$.

The input stage 114 is formed of an input transistor Q4, a load resistor R2, a diode D1, and speed-up circuit means 126 for limiting the voltage swings at the collectors of the transistors Q4 and Q2 so as to minimize propagation delays, thereby increasing their switching speeds. The input transistor Q4 has its collector coupled to a TTL power supply voltage VTTL, which is typically at +5.0 volts, via the load resistor R2. The input transistor Q4 has its base connected to an ECL ground potential GECL, which is typically at zero volts, and its emitter connected to the collector of the first input-stage transistor Q1.

The speed-up circuit means 126 consists of speed-up transistors Q5, Q14; resistors R4, R8; and diodes D6, D7 and D8. The transistor Q14 has its collector coupled to the TTL power supply potential VTTL via the resistor R4, its base coupled to the same potential VTTL via the resistor R8, and its emitter connected to the collector of the input transistor Q4. The transistor Q5 has its collector connected to the potential VTTL and its emitter connected to the collector of the second input-stage transistor Q2. The base of the transistor Q5 is connected to the cathode of the diode D6 and the anode of the diode D7. The anode of the diode D6 is connected to the base of the transistor Q14. The cathode of the diode D7 is connected to the anode of the diode DB whose cathode is tied to a TTL ground potential GTTL.

It should be apparent that the switching or threshold voltage at the base of the transistor Q5 is $V_{SCH(D7)} + V_{SCH(D8)}$ or $2V_{SCH}$ and that the threshold voltage of the base of the transistor Q14 is $2V_{SCH} + V_{SCH(D6)}$ or $3V_{SCH}$. Thus, when the emitters of the transistors Q14 and Q5 drop below a voltage of $3V_{SCH} - V_{BE(Q14)}$ and $2V_{SCH} - V_{BE(Q5)}$ respectively, these transistors will be turned on. As a result, the voltage swings at the collectors of corresponding transistors Q4 and Q2 will be limited, thereby increasing its switching speed.

The TTL output stage 116 includes an upper TTL output transistor Q8 and a lower TTL output transistor Q7. The upper transistor Q8 has its collector connected to the TTL power supply potential VTTL via a current-limiting resistor R7 and its emitter connected to the collector of the lower output transistor Q7 and to an output terminal 128. The emitter of the transistor Q7 is connected to the TTL ground potential GTTL. A Darlington transistor Q9 has its collector connected to the collector of the upper output transistor Q8 and its emitter connected to the base of the upper output transistor Q8. One end of the resistor R3 is connected to the emitter of the Darlington transistor Q9, and the other end of the resistor R3 is tied to the ground potential GTTL.

When the Darlington transistor Q9 and the upper output transistor Q8 are turned on, they combine to perform the "pull-up" function by sourcing current to the output terminal 128 from the power supply potential VTTL. This high level output voltage $V_{OH}$ on the output terminal 128 corresponds to the high or "1" logic level. When the lower output transistor Q7 is turned on, it performs the "pull-down" function by sinking current from the output terminal 128 to the ground potential GTTL. This lower level output voltage $V_{OL}$ on the output terminal 128 corresponds to the low or ∅ logic level.

The active pull-down circuit 120 is comprised of diodes D3, D4; resistors R6, R14; and a cut-off transistor Q13. The transistor Q13 has its collector coupled to the power supply potential VTTL via the resistor R14, its emitter connected to the ground potential GTTL, and its base connected to the collector of the second input-stage transistor Q2 and to the cathode of the diode D3. The anode of the diode D3 is coupled to the power supply potential VTTL via the resistor R6 and to the anode of the diode D4. The cathode of the diode D4 is tied to the collector of the out-off transistor Q13.

It is to be noted that when the voltage at the base of the transistor Q13 is at a high level it will be turned on. Thus, a voltage will appear at the anode of the diode D3 equal to $V_{BE(Q13)} + V_{SCH(D3)}$. This will, in turn, cause a voltage to appear at the collector of the transistor Q13 equal to $V_{BE(Q13)} + V_{SCH(D3)} - V_{BE(D4)}$. This latter voltage also appears across the base-emitter junction of the lower output transistor Q7, which will keep the same turned off. Consequently, the output terminal 128 will be at the high or "1" logic level. On the other hand, when the voltage at the base of the out-off transistor Q13 is at a low level, it will be turned off. Thus, the collector of the transistor Q13 will be pulled up towards the power supply potential VTTL which will cause the lower output transistor Q7 to be turned on. As a result, the output terminal 128 will now be at the low or level.

The high level voltage clamp circuit 122 consists of a resistor R9, a string of diodes D10–D115; and a Schottky diode D9. One end of the resistor R9 is tied to the TTL power supply potential VTTL, and the other end of the resistor R9 is connected to the anode of the diode D10 and the cathode of the Schottky diode D9. The cathode of the diode D15 is connected to the ground potential GTTL, and the cathode of the diode D9 is connected to the base of the Darlington transistor Q9. Therefore, the base of the transistor Q9 can go no higher than $6V_{BE(D10-D15)} + V_{SCH(D9)}$. Consequently, the high level voltage $V_{OH}$ at the output terminal 128 will go no higher than $6V_{BE(D10-D15)} + V_{SCH(D9)} - V_{BE(Q9)} - V_{BE(Q8)}$ or $4V_{BE} + V_{SCH}$. The high level voltage clamp circuit 122 serves to speed up the switching of the upper TTL output transistor Q8.

The ground bounce protection circuit 124 includes a voltage-independent current source formed of transistors Q16, Q17 and resistors R16, R17; a reference resistor R15; and a switching transistor Q15. The ground bounce protection circuit 124 functions to maintain the lower output transistor Q7 turned off due to current spikes generated on the TTL ground potential GTTL at node A. The transistor Q16 has its collector connected to the TTL power supply potential VTTL, its base coupled to the potential VTTL via the resistor R17, and its emitter connected to the base of the transistor Q17. The transistor Q17 has its collector connected to the base of the transistor Q16, and its emitter connected to one end of the resistor R16. The other end of the resistor R16 is joined to the emitter of the transistor Q16.

One end of the resistor R15 is connected to receive the current I from the current source and to the base of the switching transistor Q15. The other end of the resistor R15 is tied to the ECL ground potential GECL. which is assumed to be a clean, quite ground line. The switching transistor Q15 has its collector connected to the base of the lower output transistor Q7 and its emitter connected to the TTL ground potential GTTL.

The current I is minimized for changes due to the TTL power supply potential variations. It is realized that this current I is formed by two main components: (1) $V_{BE(Q17)}/R16$, and (2) $(VTTL - V_{OUT})/R17$, where $V_{OUT}$ is the voltage at the emitter of the transistor Q17. By minimizing the second component (i.e., by making the resistor R17 large), the majority of the current I will be from the first component which does not have any power supply dependent term in it to the first order.

Thus, this current I, which flows through the resistor R15, will create a fixed reference voltage $V_R$ at node B above the ground potential GECL. The fixed reference voltage $V_R$ likewise does not depend on the TTL power supply variation. Accordingly, whenever the ground potential GTTL at the node A is pulled lower than one diode drop ($V_{BE(Q15)}$) below the reference voltage $V_R$ the switching transistor Q15 will be turned on which diverts current from the base of the lower output transistor Q7. Consequently, the transistor Q7 will remain off when it should be. In this manner, a glitch or spike on the output terminal 128 has been eliminated which would otherwise occur if the transistor Q7 was momentarily turned on. In other words, if the switching transistor Q15 was absent the ground potential GTTL at the node A being pulled lower than one diode drop below the base-emitter voltage $V_{BE(Q7)}$ would cause the lower output transistor Q7 to be rendered conductive, thereby producing a glitch on the output terminal 128.

The tristate enable gate 118 is used to create a high impedance third state at the output terminal 128 of the translator circuit 110 when it is in an enabling mode. When the tristate enable gate 118 is in a disabling mode, the translator circuit functions as a bistable output device in the manner already described, either sourcing or sinking current at the output terminal 128 dependent upon whether the upper output transistor Q8 or the lower output transistor Q7 is conducting. The enable gate 118 includes resistors R11, R12, R13; transistors Q10, Q11; and diodes D2, D16.

The transistor Q10 has its collector coupled to the base of the Darlington transistor Q9 via the diodes D2 and D16, its base coupled to receive an enable signal OEI at input terminal 130 via the resistor R12, and its emitter connected to the TTL ground potential GTTL. One end of the resistor R13 is connected to the TTL power supply potential VTTL, and the other end of the resistor R13 is connected to the input terminal 130. The transistor Q11 has its collector connected to the base of the lower output transistor Q7, it base coupled to receive also the enable signal OEI at input terminal 132 via the resistor R11, and its emitter connected to the TTL ground potential GTTL.

When it is desired to place the enable gate 118 in the enabling mode (high impedance at the output terminal 118), the enable signal OEI at the input terminals 130 and 132 is switched from a low level to a high level. This causes both the transistors Q10 and Q11 to be turned on. With the transistor Q10 being turned on, the base of the transistor Q9 will be pulled to $V_{SAT} + 2V_{SCH}$ where $V_{SAT}$ is the saturation voltage of the transistor Q10 and where $2V_{SCH}$ are the voltage drops across the Schottky diodes D2 and D16. As a result, the transistor Q9 is turned off which in turn renders the upper output transistor Q9 non-conductive. With the transistor Q11 being turned on, base drive is diverted from the base of the lower output transistor Q7 which keeps the same turned off. In this condition, the translator circuit 110 will neither source or sink current at the output terminal 128, which is now effectively at a high impedance to any external circuitry.

Normally, the enable gate 118 is in the disabling mode (allowing the translator circuit to assume either the active high or active low state). This is achieved by switching the enabling signal OEI at the input terminals 130 and 132 from the high level to the low level. This causes both the transistors Q10 and Q11 to be turned off, which allows the bases of the transistors Q9 and Q7 to go to potentials determined by the other circuit elements of the translator circuit.

The operation of the translator circuit 110 will now be described when it is functioning as a bistable output device (i.e.. where gate 118 is disabled). Assume that the true data signal Q applied to the ECL circuit has made a high-to-low transition and the complementary data signal $\bar{Q}$ has made a low-to-high transition. This causes the transistors Q1 and Q2 to be turned on and the transistor Q12 to be turned off.

With the transistor Q1 being turned on, this in turn causes the input transistor Q4 to be turned on. As a result, base drive defining a first control signal is diverted from the base of the transistor Q9 thereby turning off the upper output transistor Q8. With the transistor Q2 being turned on, base drive is diverted from the base of the transistor Q13 of the active pulldown circuit 120 which keeps it turned off. Consequently, the voltage defining a second control signal at the base of the lower output transistor Q7 will begin to rise, thereby turning on the same. Therefore, the output terminal 128 will be in the active low state.

When the true data signal Q makes a low-to-high transition and the complementary data signal $\bar{Q}$ makes a high-to-low transition, this causes the transistors Q1 and Q2 to be turned off and the transistor Q12 to be turned on. With the transistor Q12 being turned on, base drive is diverted from the base of the transistor Q7, thereby causing it to be turned off. With the transistor Q2 being turned off, the voltage at the base of the transistor Q13 of the active pull-down circuit 120 will begin to rise via the transistor Q5, which will turn on the transistor Q13. This serves to reinforce the effect of the transistor Q12 so as to keep the transistor Q7 turned off.

With the transistor Q1 being turned off, this in turn causes the input transistor Q4 to be turned off. Thus, the voltage of the base of the Darlington transistor Q9 will begin to rise causing the upper output transistor Q8 to be turned on. Therefore, the output terminal 128 will be in the active high state. As previously explained, the series connection of the resistor RB and the diodes D6, D7, D9 create fixed potentials at the bases of the transistors Q5 and Q14. When the emitters of the transistors Q5 and Q14 drop below $2V_{SCH}-V_{BE(Q5)}$ and $3V_{SCH}-V_{BE(Q14)}$ respectively, they are turned on. This serves to limit the voltage swing at the collectors of the transistors Q4 and Q2 so as to minimize propagation delay, thereby enhancing their switching speeds.

From the foregoing detailed description, it can thus be seen that the present invention provides an improved ECL-to-TTL translator circuit which includes an active pull-down circuit, a high level voltage clamping circuit, and ground bounce protection circuit so as to provide a higher speed of operation with minimal power dissipation and a significant reduction in ground bounce noise. Further, the ground bounce protection circuit is formed of a voltage-independent current source, a reference resistor, and a switching transistor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An ECL-to-TTL translator circuit for converting ECL logic level signals to TTL logic level signals, said translator circuit comprising:

ECL circuit means (112) for receiving true and complementary data input signals having ECL logic levels and for generating input signals;

input stage means (114) responsive to said input signals for generating first and second control signals;

TTL output stage means (116) responsive to said control signals for generating at an output terminal an output signal which is TTL compatible, said output stage means including an upper TTL output transistor (Q8) and a lower TTL output transistor (Q7), said upper output transistor having its collector coupled to a TTL power supply potential via a current-limiting resistor (R7), its base coupled to receive said first control signal, and its emitter connected to said output terminal, said lower output transistor having its collector connected to said output terminal, its base coupled to receive said second control signal and its emitter connected to a TTL ground potential;

ground bounce protection circuit means (124) coupled to said lower output transistor for maintaining said lower output transistor in its turned-off condition when said ground potential is being pulled down due to the switching of said output terminal between a low logic level and a high logic level; and said ground bounce protection circuit means (124) including a voltage-independent current source, a reference resistor (R15), and a switching transistor (Q15), said current source being coupled between said TTL power supply potential and one end of said reference resistor (R15) to provide a reference voltage, the other end of said resistor (R15) being connected to an ECL ground potential, said switching transistor (Q15) having its collector connected to the base of said lower output transistor (Q7), its base connected to said one end of said reference resistor (R15), and its emitter connected to said TTL ground potential.

2. A translator circuit as claimed in claim 1, wherein said current source includes first and second transistors (Q16, Q17) and first and second resistors (R17, R16), said first transistor (Q16) having its collector connected to said TTL power supply potential, its base coupled to said TTL power supply potential via said first resistor (R17), and its emitter connected to the base of said second transistor (Q17), said second transistor (Q17) having its collector connected to the base of said first transistor (Q16) and its emitter coupled to the emitter of said first transistor (Q16) via said second resistor (R16).

3. A translator circuit as claimed in claim 1, further comprising speed-up circuit means (126) for limiting voltage swings at the output of said input stage means (114) so as to increase its switching speed.

4. A translator circuit as claimed in claim 3, wherein said speed-up circuit means (126) includes first and second speed-up transistors (Q14, Q5), first and second resistors (R4, RB), and first, second and third diodes (D6, D7, D8) for setting threshold voltages at the bases of said first and second speed-up transistors (Q14, Q5) at $3V_{SCH}-V_{BE(Q14)}$ and $2V_{SCH}-V_{BE(Q5)}$, respectively.

5. A translator circuit as claimed in claim 3, further comprising active pull-down circuit means (120) responsive to said input signals for facilitating turning off said lower output transistor (Q7) when the output terminal is switching from the low logic level to the high logic level.

6. A translator circuit as claimed in claim 1, further comprising active pull-down circuit means (120) responsive to said input signals for facilitating turning off said lower output transistor (Q7) when the output terminal is switching from the low logic level to the high logic level.

7. A translator circuit as claimed in claim 5, wherein said active pull-down circuit means (120) includes a cut-off transistor (Q13), first and second resistors (R6, R14), and first and second diodes (D3, D4), said out-off transistor (Q13) having its collector coupled to said TTL power supply potential via said first resistor (R14), its base coupled to said TTL power supply potential via said first diode (D3) and said second resistor (R6), and its emitter connected to said TTL ground potential, said second diode (D4) being coupled between said first diode (D3) and the collector of said out-off transistor (Q13), the collector of said out-off transistor (Q13) being further connected to the base of said lower output transistor (Q7).

8. A translator circuit as claimed in claim 1, further comprising clamping means (122) coupled to said upper output transistor (Q8) for clamping the high voltage level at the output terminal to a fixed upper voltage so as to increase its switching speed.

9. A translator circuit as claimed in claim 6, further comprising clamping means (122) coupled to said upper output transistor (Q8) for clamping the high voltage level at the output terminal to a fixed upper vantage so as to increase its switching speed.

10. A transactor circuit as claimed in claim 8, wherein in said clamping means (122) includes a clamping resistor (R9) and a plurality of series-connected diodes (D9–D15) coupled between the base of said upper output transistor (Q8) and said TTL ground potential, said clamping resistor (R9) being coupled between said TTL power supply potential and the junction of the cathode of a first diode of said plurality of series-connected diodes (D9–D15) and the anode of a second diode of said plurality of series-connected diodes, the anode of said first diode being coupled to the base of said upper output transistor (Q8).

11. A translator circuit as claimed in claim 1, further comprising enable gate means (118) coupled to said output stage means (116) for selectively disabling both said upper and lower output transistors (Q8, Q7) so as to provide a high impedance third level at said output terminal.

12. An ECL-to-TTL translator circuit for converting ECL logic level signals to TTL logic level signals, said translator circuit comprising:

ECL circuit means (112) for receiving true and complementary date input signals having ECL logic levels and for generating input signals;

input stage means (114) responsive to said input signals for generating first and second control signals;

TTL output stage means (116) responsive to said control signals for generating at an output terminal an output signal which is TTL compatible, said output stage means including an upper TTL output transistor (Q8) and a lower TTL output transistor (Q7), said upper output transistor having its collector coupled to a TTL power supply potential via a current-limiting resistor (R7), its base coupled to receive said first control signal, and its emitter connected to said output terminal, said lower output transistor having its collector connected to said output terminal, its base coupled to receive said second control signal and its emitter connected to a TTL ground potential;

speed-up circuit means (126) for limiting voltage swings at the output of said input stage means (114) so as to increase its switching speed;

active pull-down means (120) responsive to said input signals for facilitating turning off said lower output transistor (Q7) when the output terminal is switching from a low logic level to a high logic level;

clamping means (122) coupled to said upper output transistor (Q8) for clamping the high logic level at the output terminal to a fixed upper voltage so as to increase its switching speed;

ground bounce protection circuit means (124) coupled to said lower output transistor for maintaining said lower output transistor in its turned-off condition when said ground potential is being pulled down due to the switching of said output terminal between the low logic level and the high logic level; and enable gate means (118) coupled to said output stage means (116) for selectively disabling both said upper and lower output transistors (Q8, Q7) so as to provide a high impedance third level at said output terminal.

13. A translator circuit as claimed in claim 12, wherein said speed-up circuit means (126) includes first and second speed-up transistors (Q14, Q5), first and second resistors (R4, R8), and first, second and third diodes (D6, D7, D8) for setting threshold voltages at the bases of said first and second speed-up transistors (Q14, Q5) at $3V_{SCH}-V_{BE(Q14)}$ and $2V_{SCH}-V_{BE(Q5)}$, respectively.

14. A translator circuit as claimed in claim 12, wherein said active pull-down circuit means (120) includes a cut-off transistor (Q13), first and second resistors (R6, R14), and first and second diodes (D3, D4), said cut-off transistor (Q13) having its collector coupled to said TTL power supply potential via said first resistor R14), its base coupled to said TTL power supply potential via said first diode (D3) and said second resistor (R6), and its emitter connected to said TTL ground potential, said second diode (D4) being coupled between said first diode (D3) and the collector of said out-off transistor (Q13), the collector of said cut-off transistor (Q13) being further connected to the base of said lower output transistor (Q7).

15. A translator circuit as claimed in claim 12, wherein in said clamping means (122) includes a clamping resistor (R9) and a plurality of series-connected diodes (D9–D15) coupled between the base of said upper output transistor (Q8) and said TTL ground potential, said clamping resistor (R9) being coupled between said TTL power supply potential and the junction of the cathode of a first diode of said plurality of series-connected diodes (D9–D15) and the anode of a second diode of said plurality of series-connected diodes, the anode of said first diode being coupled to the base oF said upper output transistor (Q8).

16. An ECL-to-TTL translator circuit for converting ECL logic level signals to TTL logic level signals, said translator circuit comprising:

TTL output stage means (116) responsive to control signals for generating at an output terminal an output signal which is TTL compatible, said output stage means including an upper TTL output transistor (Q8) and a lower TTL output transistor (Q7), said upper output transistor having its collector coupled to a TTL power supply potential via a current-limiting resistor (R7), its base coupled to receive a first one of said control signals, and its emitter connected to said output terminal, said lower output transistor having its collector connected to said output terminal, its base coupled to receive a second one of said control signals and its emitter connected to a TTL ground potential;

ground bounce protection circuit means (124) coupled to said lower output transistor for maintaining said lower output transistor in its turned-off condition when said ground potential is being pulled down due to the switching of said output terminal between a low logic level and a high logic level; and said ground bounce protection circuit means including a voltage-independent current source, a reference resistor (R15), and a switching transistor (Q15), said current source being coupled between said TTL power supply potential and one end of said reference resistor (R15) to provide a reference voltage, the other end of said resistor (R15) being connected to an ECL ground potential, said switching transistor (Q15) having its collector connected to the base of said lower output transistor (Q7), its base connected to said one end of said reference resistor (R15), and its emitter connected to said TTL ground potential.

17. A translator circuit as claimed in claim 16, wherein said current source includes first and second transistors (Q16, Q17) and first and second resistors (R17, R16), said first transistor (Q16) having its collector connected to said TTL power supply potential, its base coupled to said TTL power supply potential via said first resistor (R17), and its emitter connected to the base of said second transistor (Q17), said second transistor (Q17) having its collector connected to the base of said first transistor (Q16) and its emitter coupled to the emitter of said first transistor (Q16) via said second resistor (R16).

* * * * *